United States Patent
Ishikawa et al.

(10) Patent No.: US 8,589,756 B2
(45) Date of Patent: Nov. 19, 2013

(54) SEMICONDUCTOR MEMORY DEVICE, SEMICONDUCTOR MEMORY SYSTEM, AND ERASURE CORRECTION METHOD

(75) Inventors: Yukio Ishikawa, Kanagawa (JP); Kenji Sakaue, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 13/174,935

(22) Filed: Jul. 1, 2011

(65) Prior Publication Data

US 2012/0102380 A1    Apr. 26, 2012

(30) Foreign Application Priority Data

Oct. 22, 2010    (JP) .................................. 2010-237684

(51) Int. Cl.
*H03M 13/00*    (2006.01)

(52) U.S. Cl.
USPC ........... 714/758; 714/763; 714/782; 714/752; 714/760

(58) Field of Classification Search
None
See application file for complete search history.

(56) References Cited

U.S. PATENT DOCUMENTS

| 6,288,935 | B1 | 9/2001 | Shibata et al. | |
| 7,525,840 | B2 * | 4/2009 | Rahman et al. | 365/185.03 |
| 7,836,364 | B1 * | 11/2010 | Sutardja et al. | 714/723 |
| 2004/0022087 | A1 | 2/2004 | Satori | |
| 2008/0301524 | A1 * | 12/2008 | Horisaki et al. | 714/760 |
| 2009/0055706 | A1 * | 2/2009 | Lin | 714/758 |
| 2010/0122113 | A1 * | 5/2010 | Weingarten et al. | 714/5 |
| 2012/0060060 | A1 * | 3/2012 | Danilak | 714/37 |
| 2012/0311378 | A1 * | 12/2012 | Danilak | 714/6.1 |

* cited by examiner

*Primary Examiner* — John Trimmings
(74) *Attorney, Agent, or Firm* — Oblon, Spivak, McClelland, Maier & Neustadt, L.L.P.

(57) ABSTRACT

A memory card according to an embodiment includes: a memory section having a binary storage area (SLC area) and a multi-value storage area (MLC area); an error correction section configured to correct an error of data stored in the MLC area; and an erasure correction section configured to store, in the SLC area, the position information on the multi-value memory cell storing the data having the error detected by the error correction section and configured to perform erasure correction on the basis of the position information.

8 Claims, 4 Drawing Sheets

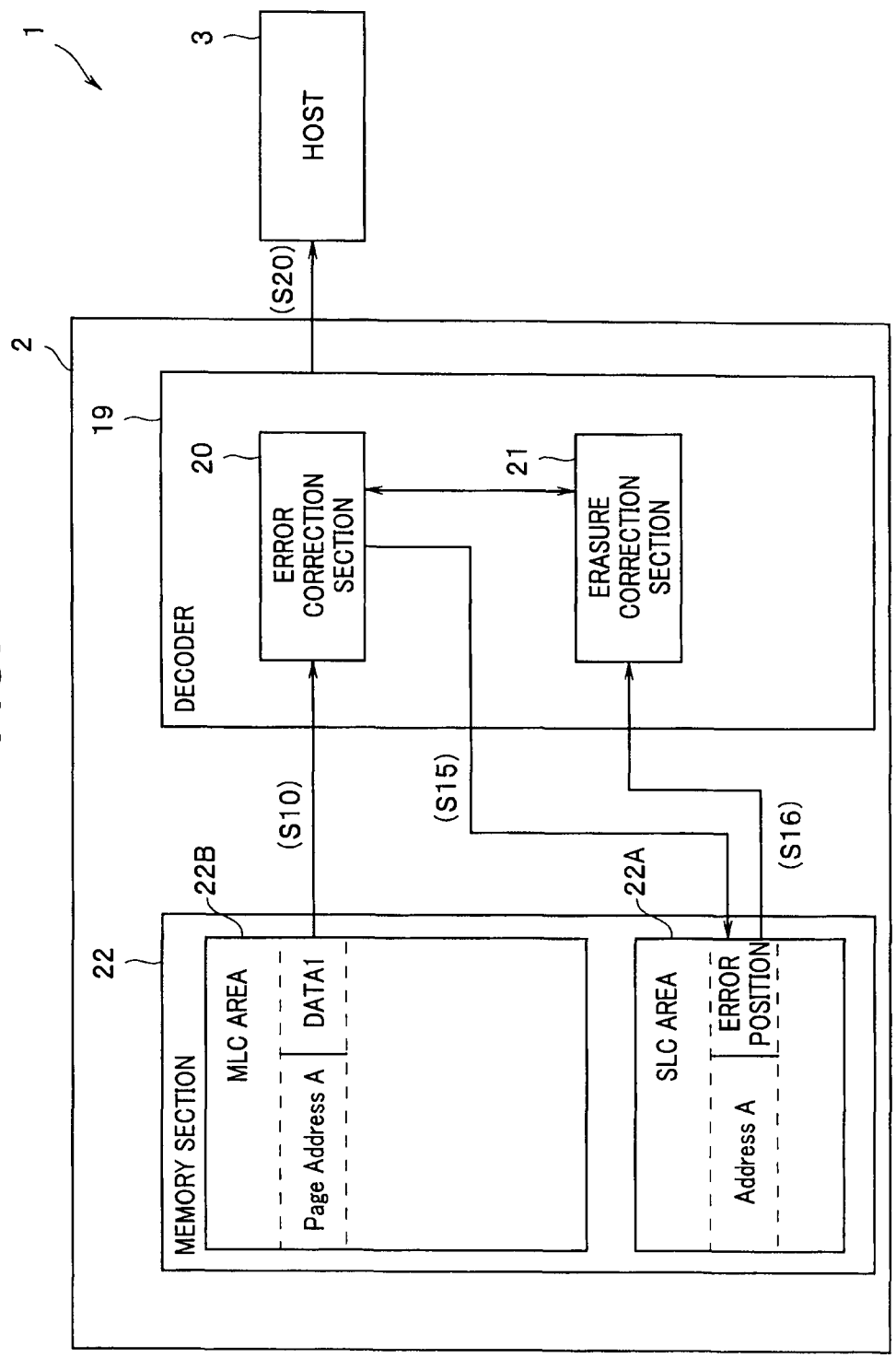

SEMICONDUCTOR MEMORY DEVICE, SEMICONDUCTOR MEMORY SYSTEM, AND ERASURE CORRECTION METHOD

CROSS-REFERENCE TO RELATED APPLICATION

This application claims the benefit of Japanese Application No. 2010-237684 filed in Japan on Oct. 22, 2010, the contents of which are incorporated herein by this reference.

FIELD

An embodiment described herein relates generally to a semiconductor memory device configured to perform erasure correction, a semiconductor memory system including the semiconductor memory device, and an erasure correction method.

BACKGROUND

A NAND-type flash memory device which is a nonvolatile semiconductor memory device has been widely used as an external memory device of a host device, such as a personal computer, a portable telephone, or a digital camera, or used as a built-in memory device of a computer system.

In the memory device, high security of data is ensured in such a manner that, when the data is stored in the memory device, the data is encoded by an error correction code, and that, when data is read from the memory device, the data is subjected to error detection/correction processing.

Here, when data is stored in the memory device, a predetermined amount of charge is injected to the charge storage layer of a memory cell via the insulating film according to the data to be stored. When the data is reproduced, the stored data is read by measuring the difference in the transistor threshold voltage corresponding to the amount of charge stored in the memory cell. That is, the memory cell has a plurality of memory states having different threshold voltages, and data stored in the memory cell is determined in correspondence with each of the memory states. In a binary memory device, data corresponding to each memory cell is determined, for example, in such a manner that data of "1" corresponds to a memory cell in the state where no charge is stored and hence the threshold voltage is low, and such that data of "0" corresponds to a memory cell in the state where an amount of charge is stored and hence the threshold voltage is high.

Further, a multi-value memory device has also been developed which is capable of storing two-bit data in a memory cell using memory states corresponding to four different threshold voltages. Note that the reliability of the multi-value memory cell is not better than the reliability of the binary memory cell.

Here, in an NAND-type flash memory section, there are restrictions on the number of times of writing/erasing and on the number of times of reading. The restriction on the number of times of writing/erasing is due to the fact that, in the writing/erasing processing, electrons are injected to the floating gate by applying to the gate a high voltage with respect to the substrate. That is, when the writing/erasing processing is repeatedly performed, the data may be destroyed due to deterioration of the oxide film around the floating gate.

On the other hand, the restriction on the number of times of reading is due to the read-disturb. The read-disturb is a phenomenon in which, since the read voltage is also applied to unselected memory cells from the word line, electrons are gradually injected to the floating gate of the unselected memory cells. That is, as only the process for reading data from a memory cell storing the data is repeated, the threshold voltage at the time of reading the data is changed so that the storage state of the data is deteriorated. Further, the number of read errors is increased, and the reliability of the read data is lowered.

BRIEF DESCRIPTION OF THE DRAWINGS

FIG. 4 is a diagram for describing the decode processing of the semiconductor memory of the embodiment.

DETAILED DESCRIPTION

In the following, a semiconductor memory device (hereinafter also referred to as "memory device") of an embodiment, and a semiconductor memory system (hereinafter also referred to as "memory system") including the memory device will be described.

Figure 1:
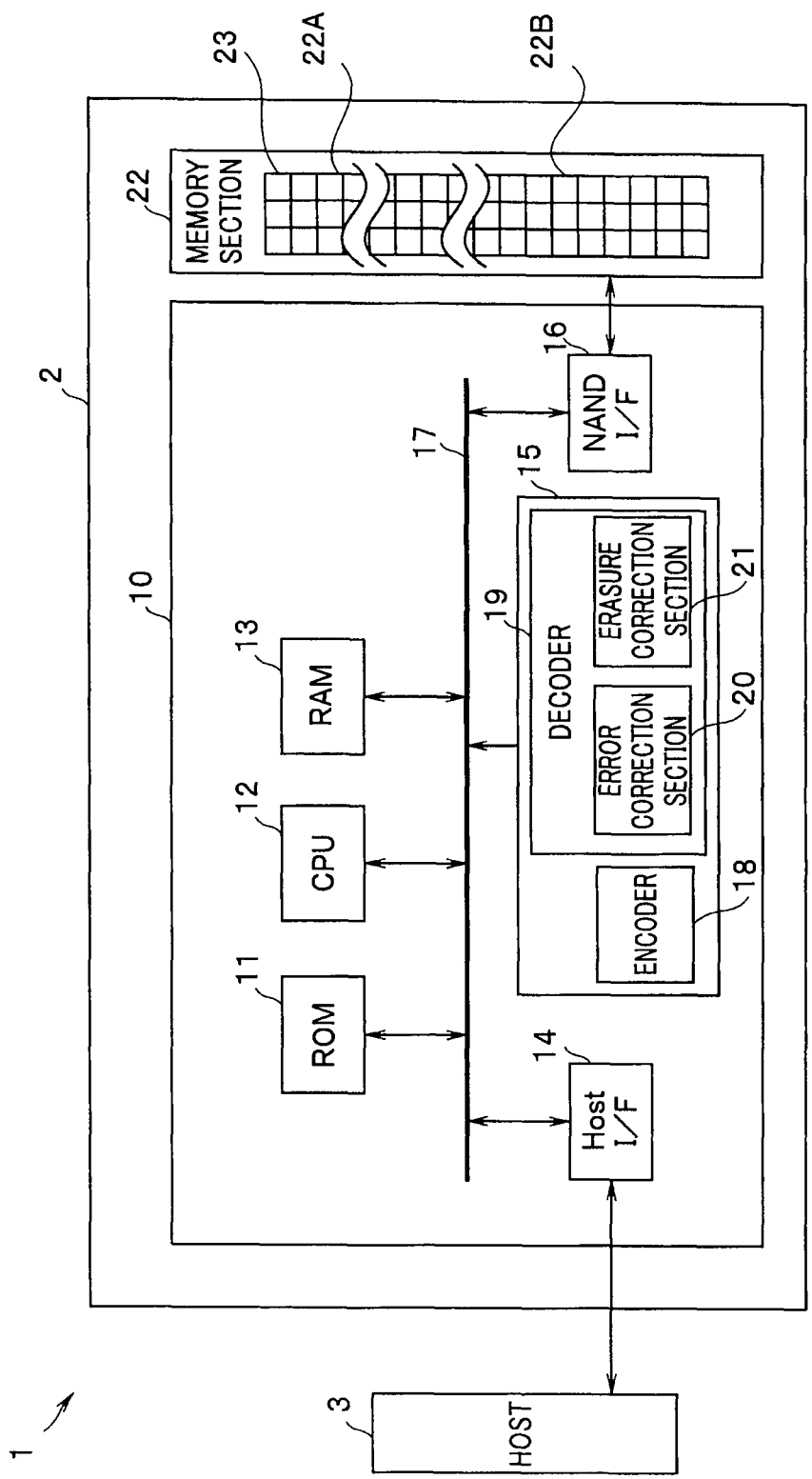
FIG. 1 is a diagram showing a configuration of a semiconductor memory system of an embodiment.

As shown in FIG. 1, a memory system 1 includes a host device (hereinafter referred to as "host") 3 and a memory card 2 which is a memory device. The host 3 is a personal computer, a digital camera, or the like, and the memory card 2 is an NAND-type flash memory device detachably connected to the host 3. Note that the memory device as an embodiment of the present invention may be configured as a so-called embedded type which is incorporated in the host to store data, such as the data to start the host, or may also be configured in a form, such as a semiconductor disk: SSD (Solid State Drive). Alternatively, the memory device and the host 3 may configure the memory system 1, such as, for example, an MP3 player used as a portable music player.

The memory card 2 includes a memory section 22 and a memory controller 10. The memory section 22 is a NAND-type flash memory section and has a configuration in which a number of memory cells 23 serving as unit cells are connected to bit lines for writing, word lines for reading, and the like. When data is stored in the memory cell 23, charge of an amount corresponding to the data is stored in the memory cell, so that the memory cell is set to a transistor threshold voltage corresponding to the stored data.

The memory section 22 of the memory card 2 according to the present embodiment includes a binary storage area 22A configured by a plurality of binary memory cells which can be set in any one of two memory states having mutually different threshold voltages, and a multi-value storage area 22B configured by a plurality of multi-value memory cells which can be set in any one of four or more memory states having mutually different threshold voltages.

Hereinafter, the binary storage area 22A is also referred to as an SLC (Single Level Cell) area, and the multi-value storage area 22B is also referred to as an MLC (Multi Level Cell) area. The MLC area 22B greatly contributes to increase the capacity of the memory card 2.

By use of a CPU 12 and through a bus 17, the memory controller 10 performs transmission and reception of data to and from the host 3 via a host I/F (interface) 14, and performs transmission and reception of data to and from the memory section 22 via a NAND I/F (interface) 16.

A ROM 11 stores firmware necessary for the operation of the CPU 12, and a RAM 13 stores information, and the like, which is rewritten during the operation of the CPU 12.

An error correction (ECC: Error Correcting Code) circuit 15 of the memory controller 10 includes an encoder 18 configured to generate, at the time of storing data, an error correction code (parity) and to impart the generated code to the data, and a decoder 19 configured to decode the encoded data read at the time of reading (reproducing) the data. Note that the memory controller 10 processes user data transmitted from the host 3 by dividing the user data into data strings (DATA1) each having a predetermined length, for example, a length of 1 KB.

The decoder 19 includes an error correction section 20 and an erasure correction section 21. According to the parity information serving as the error detection/correction code, the error correction section 20 detects and corrects an error of the data stored in the memory section 22.

Note that, in the memory card 2, read-only data, such as electronic dictionary data, to which the parity is given by the encoder 18, are stored in the multi-value storage area 22B having a high recording density.

On the other hand, when the error correction section 20 cannot correct the error of the data, the erasure correction section 21 performs erasure correction in coordination with the error correction performed by the error correction section 20. Among the read data, the erasure correction section 21 estimates the position of invalid data (erasure data) which cannot be distinguished at all as either "0" or "1", and restores the invalid data by using normal data.

For example, when a binary representation of "000, 011, 101, 110" can be considered as the data, and when it is assumed that, in the 3-bit reproduction data of "1X1", the central bit of "1X1" is known to be invalid (X=erasure), the reproduction data including the erasure bit can be correctly corrected to "101" by using the error correction code.

Generally, when it is assumed that the number of errors is L (bits) and that the number of erasure bits is H (bits), the correction capability (T bit) of the error correction section 20 is represented as $2T \geq 2L+H$ (Expression 1). In the following, a case where the maximum number of bits L corrected by the error correction section 20 is set as L=T=8 bits (at the time of H=0) will be described as an example.

Figure 2:
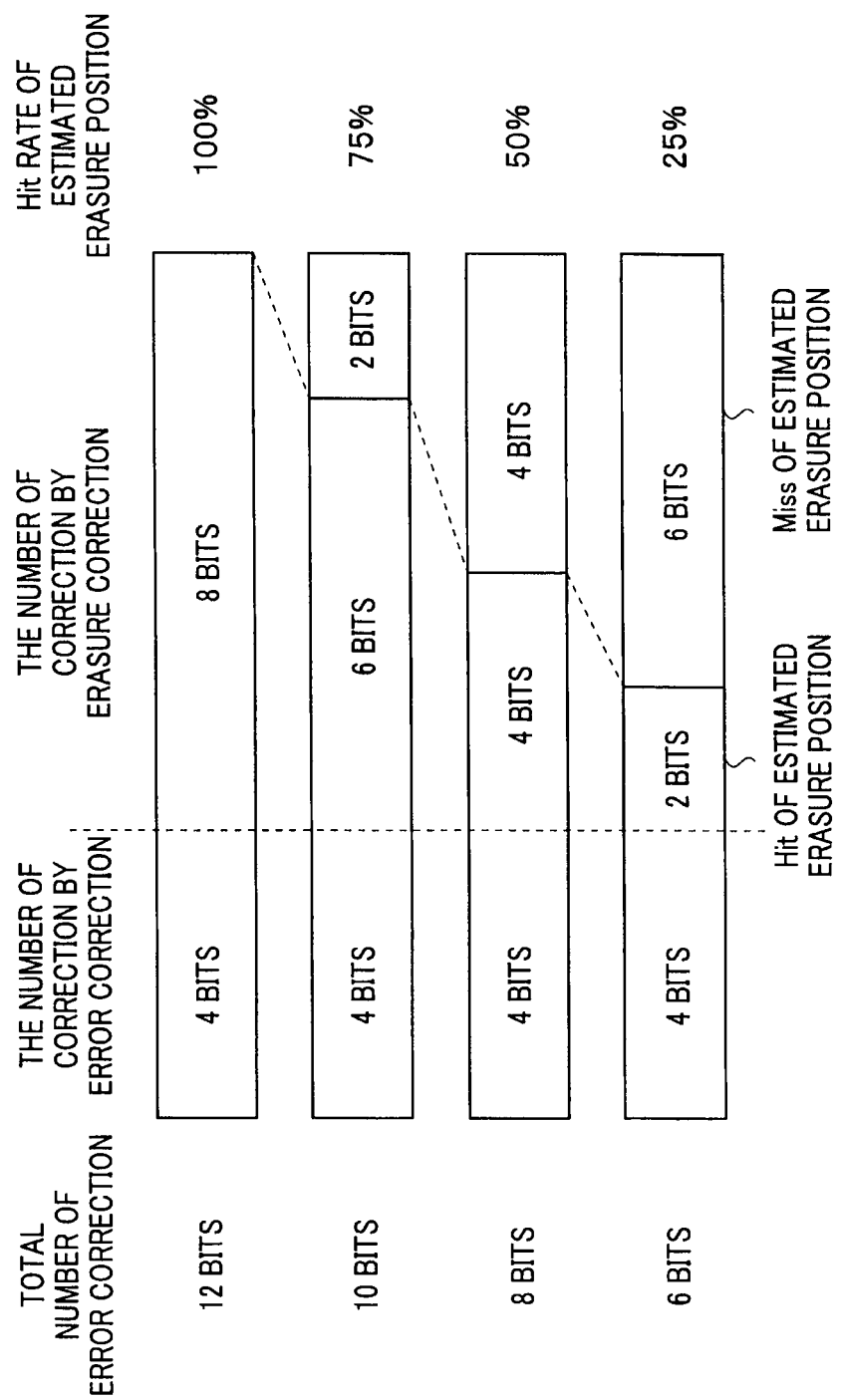
FIG. 2 is an illustration for describing erasure correction processing of the semiconductor memory of the embodiment.

As shown in FIG. 2, when data including errors of 8 bits is decoded by using the error correction and the erasure correction in combination with each other, H=8 in Expression 1. For this reason, when errors of 4 bits can be corrected by the error correction section 20, and when the number of errors of 8 bits corrected by the erasure correction section 21 is taken into account, errors of at most 12 bits can be corrected. The maximum number of errors corrected in the decoding can be achieved when the Hit rate of the estimated erasure positions is 100%, that is, when the rate at which errors exist at estimated positions is 100%. However, it is not easy to obtain the Hit rate of 100%. When the Hit rate is 75%, the total number of corrected errors becomes 10 bits, and when the Hit rate is 50%, the total number of corrected errors becomes 8 bits. When the Hit rate is 25%, the total number of corrected errors becomes 6 bits.

Note that, when the number of errors generated in the DATA1 exceeds 12 (12 bits), the errors of 12 bits (H=12 bits) can be corrected by the erasure correction section 21, and the errors of 2 bits (L=T−H/2=2 bits) can be corrected by the error correction section 20, so that the total number of errors of 14 bits can be corrected. Similarly, the maximum number of errors of 16 bits can be corrected.

That is, when the decode processing is performed by the decoder 19 by using the error correction section 20 and the erasure correction section 21 in combination with each other, it is possible to perform the error correction beyond the error correction capability achieved by the error correction section 20 by itself.

In the memory card 2, when the number of errors generated in the stored data exceeds the correction capability T of the error correction section 20, the decoder 19 switches the error correction system using the error correction section 20 to the error correction system using the error correction section 20 and the erasure correction section 21 in combination with each other. In the erasure correction of the memory card 2, the position information of a previously generated error is stored as an erasure position.

The error position information is not stored in the MLC area 22B but in the SLC area 22A which is more reliable than the MLC area 22B. Thereby, the decoder 19 can perform the erasure correction processing on the basis of the error position information having high reliability. For this reason, the Hit rate is high in the memory card 2, and hence more errors can be corrected.

Figure 3:
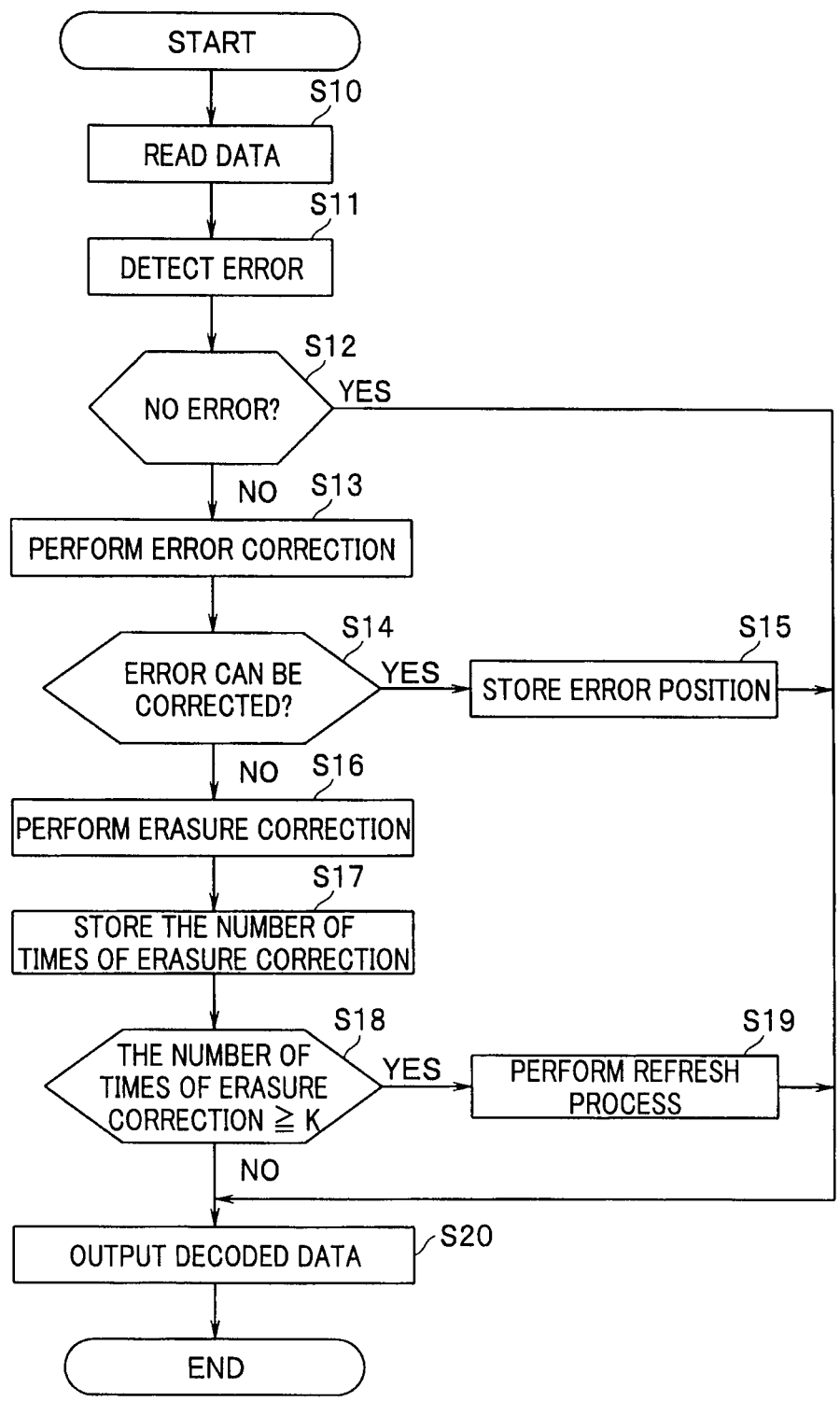
FIG. 3 is a flowchart for describing a flow of decode processing of the semiconductor memory of the embodiment.

In the following, the decode processing performed by decoder 19 will be described with reference to the flowchart of FIG. 3, and FIG. 4.

<Step S10> Data Read Process

According to an instruction from the host 3, the DATA1 stored at the page address A of the MLC area 22B in the memory section 22 is read. Here, the DATA1 is a part of read-only data, such as electronic dictionary data, in other words, a part of ROM data. In order to store much information, the DATA1 is stored in the MLC area 22B.

Note that only the read processing is repeatedly performed to the DATA1 which is a read-only data, and hence the reliability of the DATA1 is liable to be deteriorated due to the read-disturb.

<Step S11> Error Detection Process

On the basis of the parity of the DATA1, an error detection section (not shown) of the decoder 19 detects whether an error is generated in the DATA1. Note that an error detection/correction section is configured by the error detection section and the error correction section 20.

<Step S12> No Error is Generated?

When no error is generated in the DATA1 (YES), the DATA1 is outputted to the host 3 in step S20.

When an error is generated in the DATA1 (NO), the processing is performed from step S13.

<Step S13> Error Correction Process

The error correction processing using the parity is performed by the error correction section 20.

<Step S14> Correction is Possible?

When the error can be corrected by the correction processing performed by the error correction section 20 (YES), that is, when the number of errors (the number of bits) is at most T (8 bits) in the present embodiment, the processing from step S15 is performed.

That is, when the number of errors generated in the DATA1 stored at the Page Address A of the MLC area 22B is at most T, the DATA1 can be decoded only by the error correction section 20 by using the parity.

When the errors cannot be corrected by the error correction section 20 (NO), the error correction processing using the error correction and the erasure correction in combination with each other is performed in step S16.

<Step S15> Error Position Storage Process

The position information (address) on the memory cell of the MLC area 22B, storing the error bit data, is stored in the SLC area 22A as error cell position information.

That is, the position information (Column Address, Bit Address) of the error generated in the DATA1 is stored in the SLC area 22A having high reliability. Also in the case of other than the Page Address A, the position information of the error is similarly stored in the SLC area 22A after the decode processing.

Then, in step S20, the decoded DATA1 is outputted to the host 3.

Note that, since the number of errors generated in the DATA1 is generally increased due to aged deterioration, the increase in the number of times of reading, and the like, the error position information is also updated as required.

<Step S16> Erasure Correction Process

When the number of errors generated in the DATA1 exceeds T, the DATA1 cannot be decoded by the error correction section 20 alone. In this case, the decoder 19 uses, as an erasure cell position, the error cell position information previously stored and updated in the SLC area 22A, and performs the decode processing by using the error correction section 20 and the erasure correction section 21 in combination with each other. As described above, when the error correction and the erasure correction are used in combination with each other, the correction capability is greatly influenced by the estimated Hit rate representing the reliability of the information given as the erasure position, that is, representing, in this example, the rate at which the estimation that an error is added to a Column Address and a Bit Address given as the erasure cell position is correct.

The decoder 19 uses, as an erasure position, the position information of the error previously and actually generated. Therefore, the Hit rate can be efficiently and significantly increased. In particular, there is also a case where the decoder 19 configured to perform the error correction processing using the error correction and the erasure correction in combination with each other on the basis of the invalid cell (erasure cell) position information stored in the SLC area 22A having high reliability can perform the 16-bit error correction which corresponds to the maximum error correction capability of the decoder 19.

<Step S17> Number-of-Erasure-Corrections Storage Process

In the memory card 2, the number of times of error correction performed by the erasure correction section 21 is stored in the SLC area 22A together with the erasure cell position information. In other words, when an error exceeding 8 bits is generated, the number of times of the generated errors is stored in the SLC area 22A having high reliability.

<Step S18, Step S19> Refresh Process

When the number of times of the error correction performed by the erasure correction section 21 reaches a predetermined number of times KMAX or more (YES in Step S18), a refresh process is performed in step S19. That is, so-called moving processing, in which the read-only data stored in the MLC area 22B is again stored in another area of the MLC area 22B, is performed. Note that the memory of the host 3 may also be used in the refresh process.

When the frequency of execution of the refresh process is high, the service life of the memory card 2 is reduced due to the restriction on the number of times of writing and erasing. Particularly, in the memory section storing the read-only data, such as electronic dictionary data, there is a possibility that, according to the increase in the number of times of reading, correct data cannot be read and hence the reliability of the read data is deteriorated. In order to prevent the read-disturb and to maintain the reliability, it is effective to perform the refresh process (rewrite processing). However, when the number of times of the refresh process is increased, then, the service life of the memory device is reduced due to the restriction on the number of times of writing and erasing.

However, in the memory card 2, even when the number of generated errors equals or exceeds the number of errors which can be corrected by the error correction section 20, the error correction can be performed by the function of the erasure correction section 21. Thereby, the frequency of execution of the refresh process is significantly reduced, and hence the long service life of the memory card 2 is attained.

Note that all data stored in the same block as the block of the memory cell may be subjected to the moving processing, or the data may also be subjected to the moving processing in units of data of a predetermined range.

<Step S20> Decoded Data Output

The decoded DATA is outputted to the host 3.

As is apparent from the above description, in the memory card 2 and the memory system 1 according to the present embodiment, the interval of refresh process can be set long, and hence a long service life is attained. Also, in the memory card 2 and the memory system 1, the erasure information is stored in the SLC area 22A, and hence high reliability is attained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a nonvolatile memory section including a binary storage area configured by a plurality of binary memory cells and a multi-value storage area configured by a plurality of multi-value memory cells;
an error detection/correction section configured to detect and correct an error of data stored in the multi-value storage area; and
an erasure correction section configured to store, in the binary storage area, position information on bit data having an error detected by the error detection/correction section and to perform erasure correction on the basis of the position information when the error detection/correction section cannot perform an error correction.

2. The semiconductor memory device according to claim 1, wherein the data stored in the multi-value storage area is read-only data.

3. The semiconductor memory device according to claim 2, wherein, when the erasure correction is performed a predetermined number of times or more, the erasure correction section moves the data stored in the multi-value storage area to another position of the multi-value storage area.

4. A semiconductor memory system comprising:
a nonvolatile memory section including a binary storage area configured by a plurality of binary memory cells and a multi-value storage area configured by a plurality of multi-value memory cells;

an error detection/correction section configured to detect and correct an error of data stored in the multi-value storage area;

an erasure correction section configured to store, in the binary storage area, position information on bit data having the error detected by the error detection/correction section and to perform erasure correction on the basis of the position information when the error detection/correction section cannot perform an error correction; and a host device.

5. The semiconductor memory system according to claim 4, wherein the data stored in the multi-value storage area is read-only data.

6. The semiconductor memory system according to claim 5, wherein, when the erasure correction is performed a predetermined number of times or more, the erasure correction section moves the data stored in the multi-value storage area to another position of the multi-value storage area.

7. An erasure correction method comprising:

data read process for reading, according to an instruction from a host, read-only data stored at a page address of a multi-value storage area of a nonvolatile memory section;

an error detection process for detecting, on the basis of parity, whether an error is caused in the read read-only data;

an error correction process for performing decode processing using the parity;

an error position storage process for storing, as error position information in a binary storage area of the memory section, position information on error bit data; and an erasure correction process for performing decode processing by using, as an erasure position, the error position information stored in the binary storage area when the error detection/correction process cannot perform an error correction.

8. The erasure correction method according to claim 7, further comprising a refresh process for, when the erasure correction process is performed a predetermined number of times or more, moving the read-only data stored in the multi-value storage area to another position of the multi-value storage area.

* * * * *